United States Patent
Nakashima

(10) Patent No.: US 8,320,204 B2
(45) Date of Patent: Nov. 27, 2012

(54) MEMORY INTERFACE CONTROL CIRCUIT

(75) Inventor: Hidemi Nakashima, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 255 days.

(21) Appl. No.: 12/824,745

(22) Filed: Jun. 28, 2010

(65) Prior Publication Data

US 2011/0007586 A1    Jan. 13, 2011

(30) Foreign Application Priority Data

Jul. 13, 2009   (JP) .................................. 2009-164672

(51) Int. Cl.
*G11C 7/00*   (2006.01)
(52) U.S. Cl. .................... 365/193; 365/191; 365/194
(58) Field of Classification Search ............. 365/189.15, 365/191, 193, 194, 233.1
See application file for complete search history.

(56) References Cited

U.S. PATENT DOCUMENTS

| | | | |
|---|---|---|---|
| 7,038,953 B2 * | 5/2006 | Aoki | 365/189.05 |
| 7,266,022 B2 * | 9/2007 | Aoki | 365/189.05 |
| 7,480,197 B2 * | 1/2009 | Carnevale et al. | 365/201 |
| 2005/0141331 A1 * | 6/2005 | Cho | 365/233 |
| 2009/0034346 A1 | 2/2009 | Nakashima | |

FOREIGN PATENT DOCUMENTS

JP   2009-37287 A   2/2009

* cited by examiner

*Primary Examiner* — Toan Le
(74) *Attorney, Agent, or Firm* — Foley & Lardner LLP

(57) ABSTRACT

A memory interface control circuit includes an input/output circuit 10 which transmits and receives a data strobe signal DQS to and from a memory, a read control circuit 20 which determines that the data strobe signal DQS associated with a memory read, received from the input/output circuit has repeated a predetermined number of times of transitions based on information on the number of data reads and sets a mask signal MS to a mask state, and a write control circuit 30 which controls a transmission timing of outputting the data strobe signal DQS associated with a memory write from the input/output circuit 10 based on a temporal positional relationship between a data strobe output request signal DQOEN associated with the memory write and the mask signal MS.

6 Claims, 5 Drawing Sheets

MEMORY INTERFACE CONTROL CIRCUIT

REFERENCE TO RELATED APPLICATION

This application is based upon and claims the benefit of the priority of Japanese patent application No. 2009-164672, filed on Jul. 13, 2009, the disclosure of which is incorporated herein in its entirety by reference thereto.

The present invention relates to a memory interface control circuit. More specifically, the invention relates to a memory interface control circuit for reading and writing data from and to a memory such as a DDR SDRAM (Double Data Rate Synchronous Dynamic Random Access Memory).

BACKGROUND

As an IT (Information Technology) rapidly progresses, a transmission rate of data on a transmission path has become increasingly higher. For that reason, it is demanded that an electrical circuit included in a device connected to the transmission path include a function of performing large-scale and high-speed processing. Accordingly, circuit design which uses a DDR SDRAM has been frequently carried out.

In the DDR SDRAM, a data strobe signal (DQS) is used so as to inform a receiver of a timing for transferring data. The DQS is a bi-directional strobe signal, and functions as an operation reference clock for data input/output when a read/write operation is performed.

In view of data transfer between a memory read control circuit and the DDR SDRAM, it is a common practice to carry out design so that an internal circuit in the memory read control circuit is adjusted in consideration of an external transmission delay. Accordingly, there arises the need for carrying out customized design in consideration of a timing for each application even in a same circuit configuration. Then, a memory read control circuit having versatility, which does not need customized deign according to a product and performs a mask operation of the DQS, has been invented by the inventor of this application (refer to Patent Document 1).

In such a memory read control circuit, it is determined that a data strobe signal has repeated a predetermined number of times of transitions based on information on the number of data reads, and a mask signal is thereby set to a mask state. Accordingly, the data strobe signal is stably mask-controlled irrespective of the number of data reads. As a result, the need for customized design for each product is eliminated. Versatile circuit design therefore becomes possible.
[Patent Document 1]
  JP Patent Kokai Publication No. JP-P-2009-37287A

SUMMARY

The entire disclosures of the above Patent Document 1 is herein incorporated by reference thereto.

The following analysis is given by the present invention.

The memory read control circuit described in Patent Document 1 has a versatile circuit configuration which accommodates successive read commands as well. However, when switching from a read mode to a write mode is made, just switching from the read mode to the write mode may cause a bus fight (bus collision, bus competition) with respect to the data strobe signal in the write mode to occur. For this reason, it is necessary to design a write-side circuit in consideration of a switching period of time so that the DQS is transferred from a memory write control circuit to the memory after completion of transfer of the DQS from the memory to the memory read control circuit. This switching period of time is affected by an external delay or the like. Thus, the need for individually designing the write-side control circuit arises. The memory read control circuit therefore lacks versatility.

Thus there is much to be desired in the art.

According to one aspect of the present invention, there is provided a memory interface control circuit, that comprises:
  an input/output circuit which transmits and receives a data strobe signal to and from a memory;
  a read control circuit which determines that the data strobe signal associated with a memory read, received from the input/output circuit has repeated a predetermined number of times of transitions based on information on the number of data reads, and then sets a mask signal to a mask state; and
  a write control circuit which controls a transmission timing of outputting the data strobe signal associated with a memory write from the input/output circuit, based on a temporal positional relationship between a data strobe output request signal associated with the memory write and the mask signal.

The meritorious effects of the present invention are summarized as follows.

According to the present invention, a transmission timing of the data strobe signal is controlled based on a temporal positional relationship between the data strobe output request signal and the mask signal. Thus, when switching from a read to a write is made, the need for considering a delay caused by an external factor is eliminated. For that reason, versatile circuit design becomes possible.

PREFERRED MODES

Figure 1:
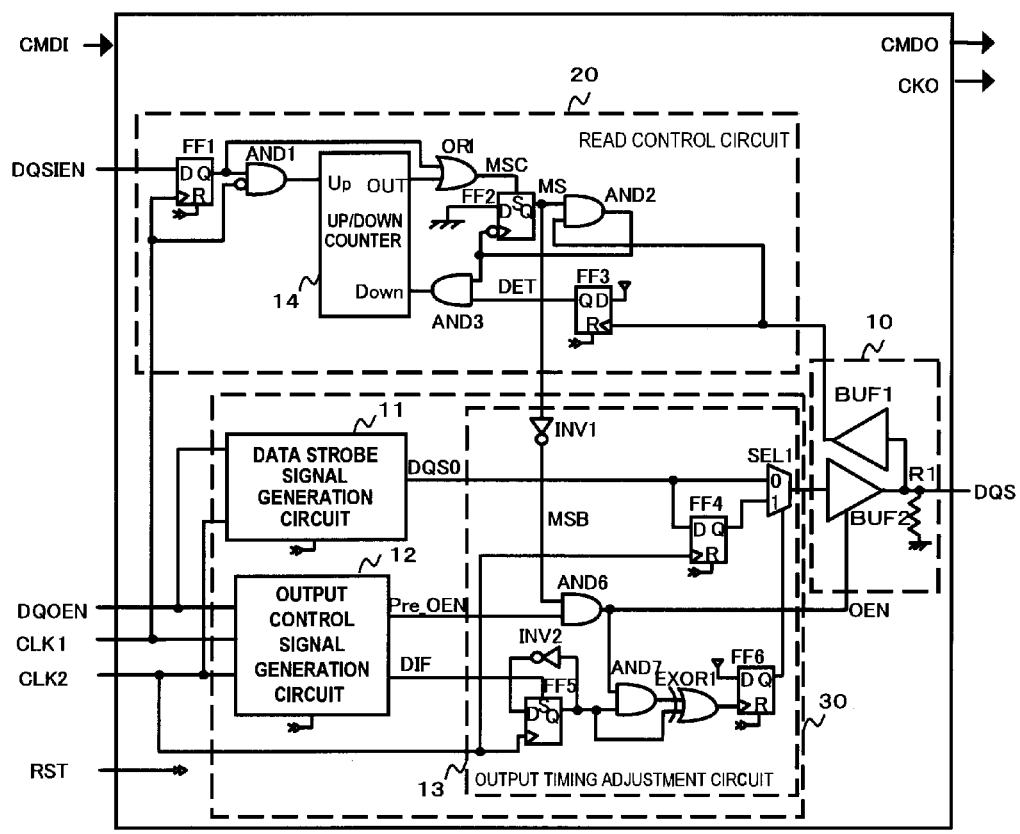
FIG. 1 is a circuit diagram of a memory interface control circuit according to an example of the present invention.

A memory interface control circuit in an exemplary embodiment of the present invention includes an input/output circuit (e.g. 10 in FIG. 1), a read control circuit (e.g. 20 in FIG. 1), and a write control circuit (e.g. 30 in FIG. 1). The input/output circuit transmits and receives a data strobe signal (e.g. DQS in FIG. 1) to and from a memory. The read control circuit determines that the data strobe signal associated with a memory read, received from the input/output circuit has repeated a predetermined number of times of transitions, based on information on the number of data reads and sets a mask signal (e.g. MS in FIG. 1) to a mask state. The write control circuit controls a transmission timing of outputting the data strobe signal associated with a memory write from the input/output circuit, based on a temporal positional relationship between a data strobe output request signal associated with the memory write and the mask signal.

The write control circuit in the memory interface control circuit may perform control so that when a first timing of transition of the data strobe output request signal from an active state to an inactive state is temporally before a second timing of transition of the mask signal from the mask state to a mask cancellation state, the data strobe signal associated with the memory write is delayed by a predetermined period of time. When the first timing is temporally after the second timing, the write control circuit may perform control so that the data strobe signal associated with the memory write is output without alteration, without being delayed.

The predetermined period of time may be a period corresponding to one cycle of the data strobe signal, in the memory interface control circuit.

The write control circuit in the memory interface control circuit may include a data strobe signal generation circuit which generates the data strobe signal associated with the memory write by activation of the data strobe output request signal, and an output timing adjustment circuit which controls the delay of the data strobe signal generated by the data strobe signal generation circuit, according to whether or not the mask signal is in the mask cancellation state.

In the memory interface control circuit, an output portion of the input/output circuit may be constituted from a tristate buffer. The write control circuit may further include an output control signal generation circuit which generates a timing signal that controls the tristate buffer by activation of the data strobe output request signal. The output timing adjustment circuit may perform control using the timing signal so that the tristate buffer becomes active when the data strobe signal generated by the data strobe signal generation circuit is output from the tristate buffer.

The read control circuit in the memory interface control circuit may include a data strobe detection circuit which detects a preamble of the data strobe signal output from the memory, a mask circuit which allows the data strobe signal to be masked by the mask signal, and a mask control circuit. The mask control circuit receives the information on the number of data reads associated with a request of reading data from the memory, determines that the data strobe signal has repeated a predetermined number of times of transitions after the preamble based on information on the number of data reads, and performs control so that the mask signal is set to the mask state.

According to the memory interface control circuit as described above, the read control circuit outputs the mask signal to a write side, thereby notifying a timing of switching from a read operation to a write operation to the write side. When the data strobe signal is output after switching to the write operation has been made, the write control circuit determines by the mask signal whether or not the read operation has been completed, and outputs the data strobe signal which is delayed as necessary so that a bus fight may be avoided. Accordingly, the need for considering an external delay associated with the write operation is eliminated. Versatility may be thereby provided.

A detailed description will be given below in connection with an example, with reference to drawings.

FIRST EXAMPLE

FIG. 1 is a circuit diagram of a memory interface control circuit in an example of the present invention. Referring to FIG. 1, the memory interface control circuit receives a clock signal CLK1 from an outside (user circuit) not shown, and a command signal CMDI associated with a read request/write request, which is synchronous with the clock signal CLK1, and outputs to a memory such as a DDR SDRAM a clock signal CKO and a command signal CMDO synchronous with the clock signal CKO. The memory interface control circuit receives read data not shown and a data strobe signal DQS which indicates a timing for the read data, corresponding to the command signal CMDO. The memory interface control circuit further outputs to the memory write data not shown and the data strobe signal DQS which indicates a timing for the write data. The memory interface control circuit further receives a clock signal CLK2 having twice the speed of the clock signal CLK1, a reset signal RST, a signal DQSIEN indicating a duration of the data strobe signal DQS, and a data strobe output request signal DQOEN. The memory interface control circuit includes an input/output circuit 10, a read control circuit 20, and a write control circuit 30.

The input/output circuit 10 is a circuit which receives and outputs the data strobe signal DQS from and to the memory. The input/output circuit 10 includes a resistance element R1 with one end thereof connected to the ground, a buffer circuit BUF1 with an input thereof connected to the other end of the resistance element R1, and a buffer circuit BUF2 with an output thereof connected to the other end of the resistance element R1. The buffer circuit BUF1 receives and buffers the data strobe signal DQS from the memory and outputs the buffered data strobe signal DQS to the read control circuit 20. The buffer circuit BUF2 is constituted from a tristate buffer. When an enable signal OEN is high, the buffer circuit BUF2 receives and buffers the data strobe signal DQS output from the write control circuit 30, and outputs the buffered data strobe signal DQS to the memory. When the enable signal OEN is low, the buffer circuit BUF2 causes its output to be in a high-impedance state.

The read control circuit 20 includes an up/down counter 14, flip-flop circuits FF1, FF2, and FF3, AND circuits AND1, AND2, and AND3, and an OR circuit OR1. The flip-flop circuit FF1 receives the signal DQSIEN indicating the duration of the data strobe signal DQS and performs retiming in response to the clock signal CLK1. The AND circuit AND1 takes a logical product of an output signal of the flip-flop circuit FF1 and a negative logic of the clock signal CLK1, and outputs the logical product to an up signal input terminal UP of the up/down counter 14. Two input terminals of the OR circuit OR1 are connected to an output terminal OUT of the up/down counter 14 and an output terminal (Q) of the flip-flop circuit FF1, and outputs a mask control signal MSC obtained by taking a logical sum of outputs of the output terminals OUT and (Q) to a set terminal (S) of the flip-flop circuit FF2.

An input end of the buffer circuit BUF1 is grounded (pulled down) through the resistance element R1. The buffer circuit BUF1 receives the data strobe signal DQS from the memory and outputs the data strobe signal DQS to a clock input terminal of the flip-flop circuit FF3 and one input terminal of the AND circuit AND2. A D terminal of the flip-flop circuit FF3 is connected to a (high-level) power supply. The flip-flop circuit FF3 causes an output signal DET to go high at a rise of the data strobe signal DQS and outputs the output signal DET to one input terminal of the AND circuit AND3.

In the flip-flop circuit FF2, an output of the AND circuit AND2 is connected to a clock input terminal of the flip-flop circuit FF2. A D terminal of the flip-flop circuit FF2 is grounded. The flip-flop circuit FF2 outputs a mask signal MS to the other input terminal of the AND circuit AND2 and the write control circuit 30 from a Q terminal thereof. An output terminal of the AND circuit AND2 is connected to the clock input terminal of the flip-flop circuit FF2 and the other input terminal of the AND circuit AND3. An output of the AND circuit AND3 is connected to a down signal input terminal Down of the up/down counter 14. The reset signal RST is supplied to a reset terminal (R) of each of the flip-flop circuits FF1 and FF3.

The write control circuit 30 includes a data strobe signal generation circuit 11, an output control signal generation circuit 12, and an output timing adjustment circuit 13.

Figure 2:
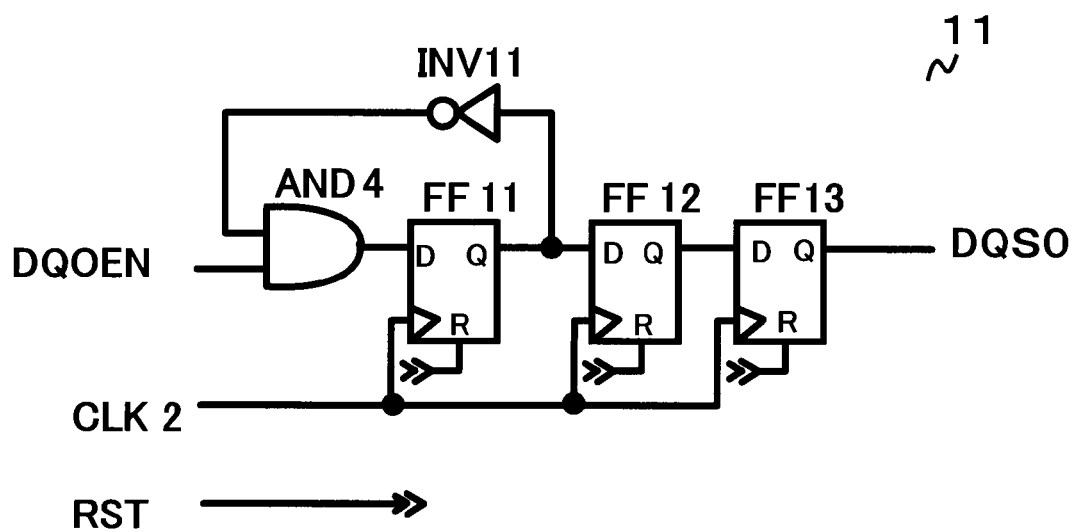
FIG. 2 is a circuit diagram showing an example of a data strobe signal generation circuit.

Next, details of the data strobe signal generation circuit 11 will be described. FIG. 2 is a circuit diagram showing an example of the data strobe signal generation circuit 11. The data strobe signal generation circuit 11 includes flip-flop circuits FF11 to FF13, an AND circuit AND4, and an inverter circuit INV11. The AND circuit AND4 takes a logical product of a signal obtained from an output (Q) of the flip-flop circuit F11 through the inverter circuit INV11 and the data strobe output request signal DQOEN and outputs the logical product to a D terminal of the flip-flop circuit FF11. The output (Q) of the flip-flop circuit FF11 and an output (Q) of the flip-flop circuit FF12 are respectively connected to D terminals of the flip-flop circuits FF12 and FF13. The flip-flop circuit FF13 outputs a data strobe signal DQS0 from an output terminal (Q) thereof. The clock signal CLK2 is supplied to respective clock terminals of the flip-flop circuits FF11 to FF13 and the reset signal RST is supplied to respective reset terminals (R) of the flip-flop circuits FF11 to FF13.

The data strobe signal generation circuit 11 having such a configuration is reset by the reset signal RST. Then, the data strobe signal generation circuit 11 performs retiming of the data strobe output request signal DQOEN using the clock signal CLK2 and delays the data strobe output request signal DQOEN, thereby generating the data strobe signal DQS0 from which the data strobe signal DQS at a time of a write operation is generated. The data strobe signal generation circuit 11 outputs the data strobe signal DQS0 to the output timing adjustment circuit 13.

Figure 3:
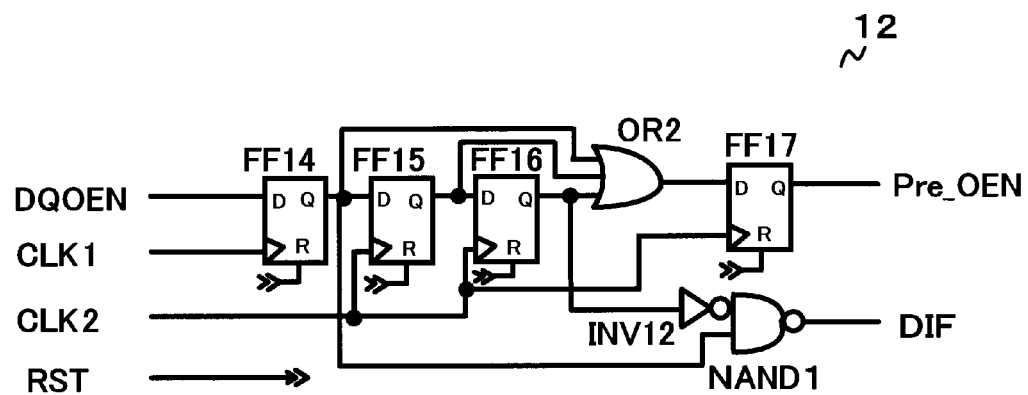
FIG. 3 is a circuit diagram showing an example of an output control signal generation circuit.

Next, details of the output control signal generation circuit 12 will be described. FIG. 3 is a circuit diagram showing an example of the output control signal generation circuit. The output control signal generation circuit 12 includes flip-flop circuits FF14 to FF17, a NAND circuit NAND1, an inverter circuit INV12, and an OR circuit OR2. A D terminal of the flip-flop circuit FF14 receives the data strobe output request signal DQOEN, and an output (Q) of the flip-flop circuit FF14 is connected to a D terminal of the flip-flop circuit FF15. An output terminal (Q) of the flip-flop circuit FF15 is connected to a D terminal of the flip-flop circuit FF16. The OR circuit OR2 takes a logical sum of the respective outputs (Q) of the flip-flop circuits FF14 and FF15 and an output (Q) of the flip-flop circuit FF16, and outputs the logical sum to a D terminal of the flip-flop circuit FF17. The flip-flop circuit FF17 outputs an output request signal Pre_OEN from an output terminal (Q) thereof. The NAND circuit NAND1 takes a logical product of a signal obtained by logically inverting the output (Q) of the flip-flop circuit FF16 by the inverter circuit INV12 and an output (Q) of the flip-flop circuit FF14, and outputs a signal obtained by logically inverting the logical product as a differential signal DIF. The clock signal CLK1 is supplied to a clock terminal of the flip-flop circuit 14, and the reset signal RST is supplied to a reset terminal (R) of the flip-flop circuit 14. The clock signal CLK2 is supplied to respective clock terminals of the flip-flop circuits FF15 to FF17, and the reset signal RST is supplied to respective reset terminals (R) of the flip-flop circuits FF15 to FF17.

The output control signal generation circuit 12 having such a configuration is reset by the reset signal RST. Then, the output control signal generation circuit 12 performs retiming of the data strobe output request signal DQOEN using the clock signals CLK1 and CLK2 and delays the data strobe output request signal DQOEN, thereby generating the output request signal Pre_OEN from which the enable signal OEN is generated and the differential signal DIF, and outputting the output request signal Pre_OEN and the differential signal DIF to the output timing adjustment circuit 13.

Next, details of the output timing adjustment circuit 13 will be described. Referring to FIG. 1, the output timing adjustment circuit 13 includes flip-flop circuits FF4 to FF6, AND circuits AND6 and AND7, inverter circuits INV1 and INV2, an exclusive logical sum circuit EXOR1, and a selector SEL1. The AND circuit AND6 outputs the enable signal OEN to a control terminal of the buffer circuit BUF2 and one input terminal of the AND circuit AND7. The enable signal OEN is a logical product between a signal MSB and the output request signal Pre_OEN. The signal MSB is obtained by inverting the mask signal MS by the inverter circuit INV1. The flip-flop circuit FF5 receives an output (Q) thereof at a D terminal thereof through the inverter circuit INV2. The flip-flop circuit FF5 receives the differential signal DIF at a set terminal (S) thereof, and connects the output terminal (Q) to the other input terminal of the AND circuit AND7 and one input terminal of the exclusive logical sum circuit EXOR1. The other input terminal of the exclusive logical sum circuit EXOR1 is connected to an output terminal of the AND circuit AND7. An output terminal of the exclusive logical sum circuit EXOR1 is connected to a clock terminal of the flip-flop circuit FF6. A D terminal of the flip-flop circuit FF6 is connected to the (high level) power supply. An output terminal (Q) of the flip-flop circuit FF6 is connected to a control terminal of the selector SEL1. The selector SEL1 selects the data strobe signal DQS0 or a signal obtained by delaying the data strobe signal DQS0 through the flip-flop circuit FF4 according to the level of the enable signal OEN, and outputs the selected signal to the buffer circuit BUF2. The clock signal CLK2 is supplied to clock terminals of the flip-flop circuits FF4 and FF5. The reset signal RST is supplied to reset terminals (R) of the flip-flop circuits FF4 and FF6.

The output timing adjustment circuit 13 having such a configuration is reset by the reset signal RST. Then, the output timing adjustment circuit 13 receives the data strobe signal DQS0, output request signal Pre_OEN, differential signal DIF, mask signal MS, and clock signal CLK2, and controls a transmission timing of outputting the data strobe signal DQS0 to the buffer circuit BUF2, based on a temporal positional relationship between the output request signal Pre_OEN and the mask signal MS. When the output timing adjustment circuit 13 outputs the data strobe signal DQS0 to the buffer circuit BUF2, the output timing adjustment circuit 13 causes the enable signal OEN to go high so that the buffer circuit BUF2 becomes active.

Figure 4:
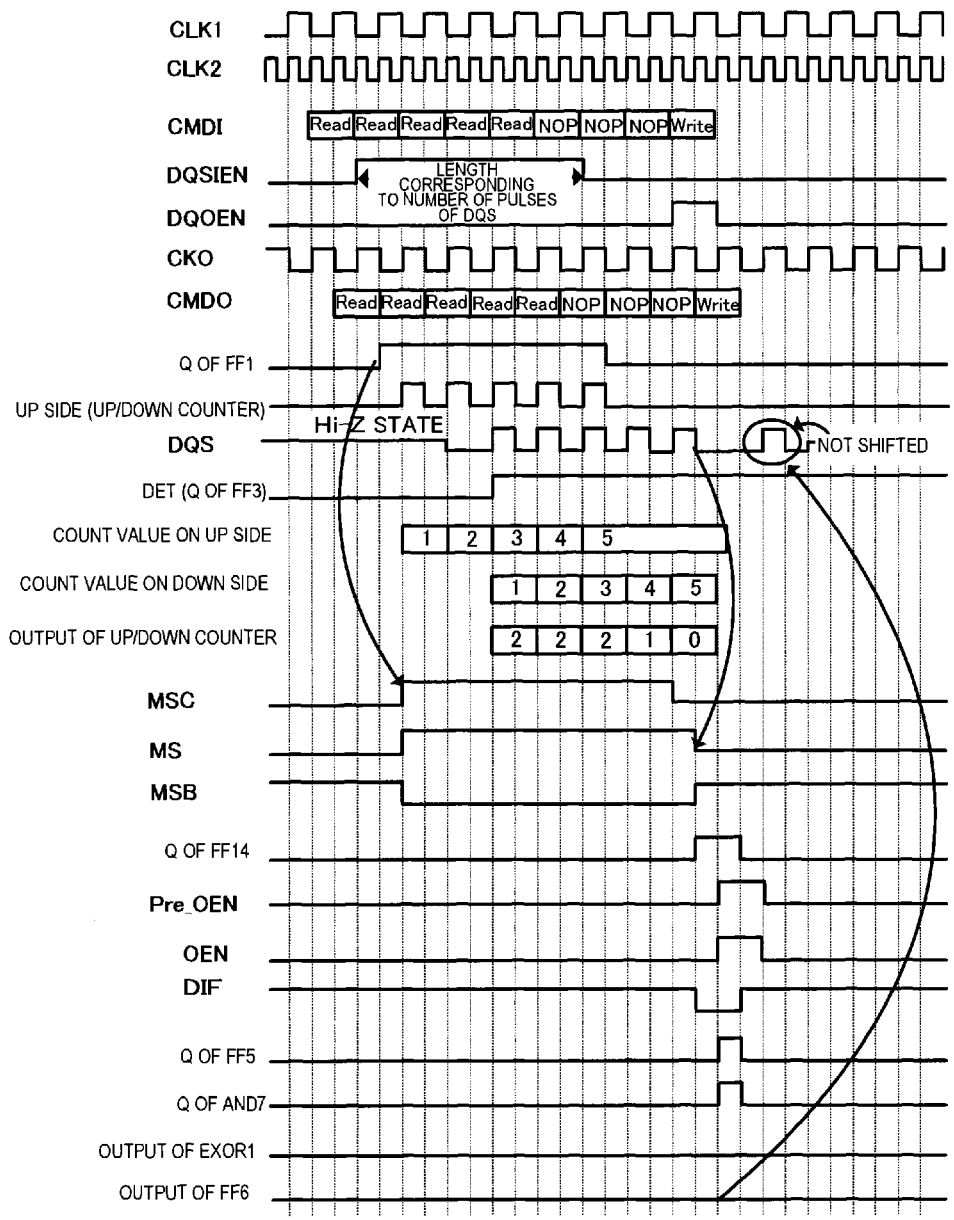
FIG. 4 is a first timing chart showing an operation of the memory interface control circuit in the example of the present invention.
Figure 5:
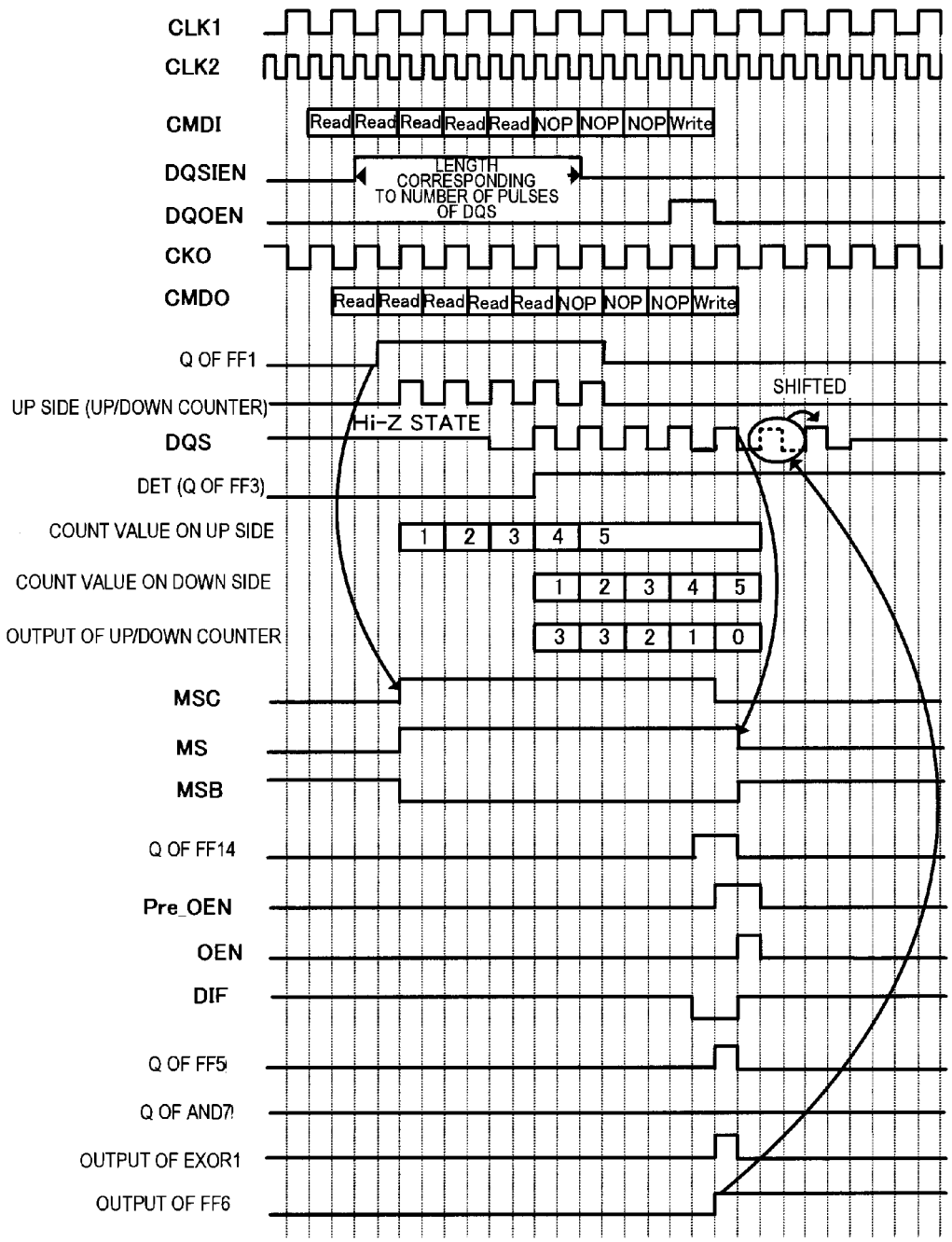
FIG. 5 is a second timing chart showing an operation of the memory interface control circuit in the example of the present invention.

Next, an operation of the memory interface control circuit will be described. FIGS. 4 and 5 are timing charts each showing an operation of the memory interface control circuit according to the example of the present invention.

Referring to FIGS. 4 and 5, when the memory interface control circuit performs a read operation, the memory interface control circuit receives the signal DQSIEN indicating the duration of the data strobe signal DQS from the user circuit. That is, a segment during which the signal DQSIEN is high is equivalent to a length corresponding to the number of pulses of the input data strobe signal DQS, which is herein equal to the number of read commands. A logical product between the clock signal CLK1 and an output of the flip-flop circuit FF1 is taken by the AND circuit AND1 so that an UP side of the up/down counter 14 performs counting for the period of segment during which the signal DQSIEN is high. The up/down counter 14 takes out and receives the signal indicating the number of pulses of the data strobe signal DQS using the clock signal CLK1, and performs counting for the period of the segment during which the signal DQSIEN is high. When the data strobe signal DQS is received from the memory, the flip-flop circuit FF3 goes high at an initial pulse of the data strobe signal DQS at which the data strobe signal DQS goes high from low. Counting by a Down side of the up/down counter 14 is then started.

Then, the number of received pulses of the data strobe signal DQS is subtracted from the value of counting for the period of the segment during which the signal DQSIEN is high. During the period in which the resulting value is not zero, the signal MSC is high. Thus, the flip-flop circuit FF2 is set, and the mask signal MS goes high.

Then, when the last pulse of the data strobe signal DQS for the closing stage of the read operation is received, an output of the up/down counter 14 assumes zero. Setting of the flip-flop circuit FF2 is released, and the mask signal MS goes low at a fall of the data strobe signal DQS. The inverted signal MSB of the mask signal MS is supplied to the AND circuit AND6.

When the memory interface control circuit performs a write operation, the memory interface control circuit receives the data strobe output request signal DQOEN from the user circuit. Then, the data strobe signal DQS0 and the enable signal OEN are generated from the data strobe output request signal DQOEN. In this case, the flip-flop circuit FF4 which delays the data strobe signal DQS0 by one bit (which corresponds to one cycle of the clock signal CLK1 or a period of time corresponding to one cycle of the data strobe signal DQS) is provided. The selector SEL1 operates so that the data strobe signal DQS0 is output without alteration or with a delay by one bit i.e. under switching-over between two modes.

The enable signal OEN is generated by taking the logical product of the inverted signal MSB and the output request signal Pre_OEN. The output control signal generation circuit 12 generates the differential signal DIF from the data strobe output request signal DQOEN. In the output timing adjustment circuit 13, the differential signal DIF is supplied to the set terminal of the flip-flop circuit FF5. Only during the period in which setting is released, the flip-flop circuit is toggled using the clock signal CLK2 to generate a pulse. Then, a logical product between this pulse and the enable signal OEN is output from the AND circuit AND7. The exclusive logical sum circuit EXOR1 takes an exclusive logical sum between this logical product and the output pulse of the flip-flop circuit FF5.

When a rise timing of the output request signal Pre_OEN is before a rise timing of the inverted signal MSB as shown in FIG. 4, the exclusive logical sum circuit EXOR1 outputs a high level. Then, an output of the flip-flop circuit FF6 goes high, and an output of the selector SEL1 is switched to 1, thereby delaying (shifting) the data strobe signal DQS0 by one pulse. A bus fight is thereby avoided.

On the other hand, when the rise timing of the output request signal Pre_OEN is after the rise timing of the inverted signal MSB as shown in FIG. 4, the exclusive logical sum circuit EXOR1 outputs a low level. Then, the output of the flip-flop circuit FF6 is also low, and the output of the selector SEL1 is switched to 0. Then, it is determined that the bus fight can be avoided without delaying (shifting) the data strobe signal DQS0 by one bit, and the data strobe signal DQS0 is output without alteration.

As described above, the write control circuit 30 receives the mask signal MS generated by the read control circuit 20. When the rise of the output request signal Pre_OEN is before the rise of the inverted signal MSB of the mask signal MS, the write control circuit 30 causes the data strobe signal DQS0 to be delayed by one bit. When the rise of the output request signal Pre_OEN is after the rise of the inverted signal MSB, the write control circuit 30 causes the data strobe signal DQS0 not to be delayed by one bit and to be output without alteration. The bus fight is thereby avoided. In the memory interface control circuit including the write control circuit 30 as described above, an external delay associated with a write operation does not need to be considered. Versatility can be thereby provided.

The disclosure of the Patent Document listed above is incorporated herein by reference. Modification and adjustment of the exemplary embodiment and the example are possible within the scope of the entire disclosure (including claims) of the present invention, and based on the basic technical concept of the invention. Various combinations and selections of various disclosed elements are possible within the scope of the claims of the present invention. That is, the present invention of course includes various variations and modifications that could be made by those skilled in the art according to the entire disclosure including the claims and the technical concept.

What is claimed is:

1. A memory interface control circuit, comprising:
   an input/output circuit which transmits and receives a data strobe signal to and from a memory;
   a read control circuit which determines that the data strobe signal associated with a memory read, received from the input/output circuit has repeated a predetermined number of times of transitions based on information on the number of data reads, and then sets a mask signal to a mask state; and
   a write control circuit which controls a transmission timing of outputting the data strobe signal associated with a memory write from the input/output circuit, based on a temporal positional relationship between a data strobe output request signal associated with the memory write and the mask signal, wherein
   the write control circuit performs control so that when a first timing of transition of the data strobe output request signal from an active state to an inactive state is temporally before a second timing of transition of the mask signal from the mask state to a mask cancellation state, the data strobe signal associated with the memory write is delayed by a predetermined period of time; and
   when the first timing is temporally after the second timing, the write control circuit performs control so that the data strobe signal associated with the memory write is output without alteration, without being delayed.

2. The memory interface control circuit according to claim 1, wherein
   the predetermined period of time corresponds to one cycle of the data strobe signal.

3. The memory interface control circuit according to claim 1, wherein the write control circuit comprises:
   a data strobe signal generation circuit which generates the data strobe signal associated with the memory write by activation of the data strobe output request signal; and
   an output timing adjustment circuit which controls the delay of the data strobe signal generated by the data strobe signal generation circuit, according to whether or not the mask signal is in the mask cancellation state.

4. The memory interface control circuit according to claim 3, wherein
   an output section of the input/output circuit comprises a tristate buffer;
   the write control circuit further comprises an output control signal generation circuit which generates a timing signal that controls the tristate buffer by activation of the data strobe output request signal; and
   the output timing adjustment circuit performs control using the timing signal so that the tristate buffer becomes active when the data strobe signal generated by the data strobe signal generation circuit is output from the tristate buffer.

5. The memory interface control circuit according to claim 1, wherein
the read control circuit comprises:
a data strobe detection circuit which detects a preamble of the data strobe signal output from the memory;
a mask circuit which allows the data strobe signal to be masked by the mask signal; and
a mask control circuit which receives the information on the number of data reads associated with a request of reading data from the memory, determines that the data strobe signal has repeated the predetermined number of times of transitions after the preamble based on the information on the number of data reads, and performs control so that the mask signal is set to the mask state.

6. A method of operation of a memory interface control circuit, the method comprising:
determining, via a read control circuit, that a data strobe signal associated with a memory read, has repeated a predetermined number or times of transitions based on information on the number of data reads, and then setting a mask signal to a mask state;
controlling a transmission timing of outputting the data strobe signal associated with a memory write, based on a temporal positional relationship between a data strobe output request signal associated with the memory write and the mask signal, wherein
the transmission timing is controlled so that:
when a first timing of transition of the data strobe output request signal from an active state to an inactive state is temporally before a second timing of transition of the mask signal from the mask state to a mask cancellation state, the data strobe signal associated with the memory write is delayed by a predetermined period of time; and
when the first timing is temporally after the second timing, the data strobe signal associated with the memory write is output without alteration, without being delayed.

* * * * *